(12) United States Patent
Summerfelt

(10) Patent No.: US 6,867,447 B2
(45) Date of Patent: Mar. 15, 2005

(54) FERROELECTRIC MEMORY CELL AND METHODS FOR FABRICATING THE SAME

(75) Inventor: Scott Summerfelt, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/441,619

(22) Filed: May 20, 2003

(65) Prior Publication Data

US 2004/0235245 A1 Nov. 25, 2004

(51) Int. Cl.⁷ .............................................. H01L 29/76
(52) U.S. Cl. ........................ 257/295; 257/301; 257/303
(58) Field of Search ................................. 257/295, 301, 257/303

(56) References Cited

U.S. PATENT DOCUMENTS

| | | |
|---|---|---|
| 5,198,384 A | 3/1993 | Dennison |
| 6,444,542 B2 | 9/2002 | Moise et al. |
| 6,710,385 B2 * | 3/2004 | Takashima .................. 257/295 |
| 6,730,950 B1 * | 5/2004 | Seshadri et al. ............ 257/295 |

* cited by examiner

Primary Examiner—David Nelms
Assistant Examiner—Quoc Hoang
(74) Attorney, Agent, or Firm—Jacqueline J. Garner; W. James Brady, III; Frederick J. Telecky, Jr.

(57) ABSTRACT

Semiconductor devices and ferroelectric memory cells therefor are provided, where the cells include a ferroelectric capacitor with one or more corners, as well as a transistor. Conductive bitline structures are located near the corners of ferroelectric cell capacitors to facilitate increased memory cell density and/or to increase capacitor area within a given cell area. Methods are disclosed for fabricating semiconductor devices with ferroelectric memory cells, wherein bitline structures are located near one or more corners of the ferroelectric cell capacitors.

20 Claims, 13 Drawing Sheets

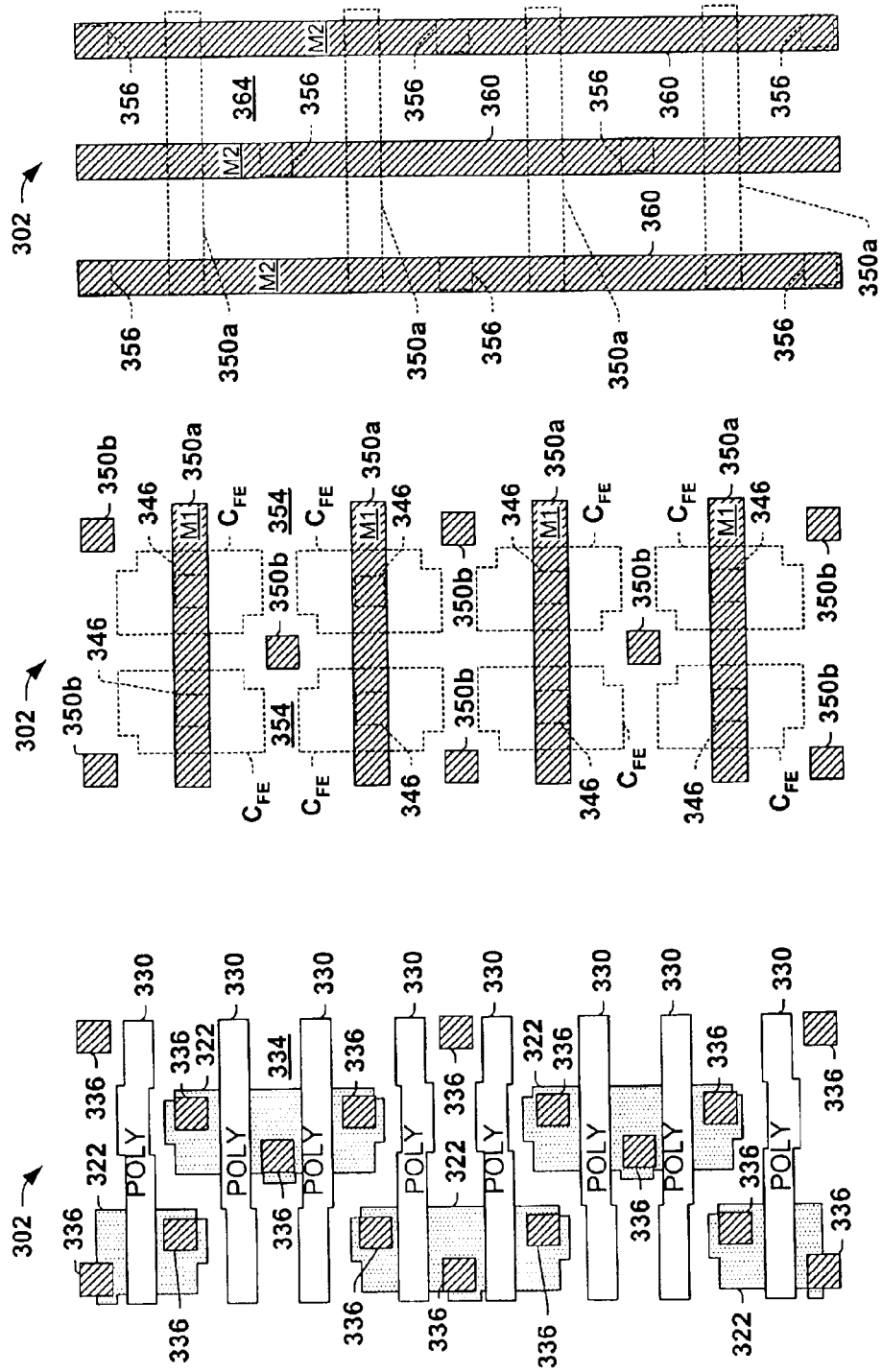

FERROELECTRIC MEMORY CELL AND METHODS FOR FABRICATING THE SAME

CROSS-REFERENCE TO RELATED PATENT/PATENT APPLICATIONS

This application is related to co-pending U.S. patent application Ser. No. 10/620,196 filed Jul. 15, 2003, TI Case No. 35853, which is entitled "Ferroelectric Memory Cell With Angled Cell Transistor Active Region and Methods for Fabricating the Same".

FIELD OF INVENTION

The present invention relates generally to semiconductor devices and more particularly to ferroelectric memory cells and manufacturing methods therefor.

BACKGROUND OF THE INVENTION

Memory is used for storage of data and/or program code in many electronic products, such as personal computer systems, embedded processor-based systems, video image processing circuits, portable phones, and the like. Memory cells may be provided in the form of a dedicated memory integrated circuit (IC) or may be included within a processor or other IC as on-chip memory. Ferroelectric memory, sometimes referred to as "FRAM" or "FERAM", is a non-volatile form of memory commonly organized in single-transistor, single-capacitor (1T1C) or two-transistor, two-capacitor (2T2C) configurations, in which each memory cell includes one or more access transistors. The cells are typically organized in an array, and are selected by plateline and wordline signals from address decoder circuitry, with the data being read from or written to the cells along bitlines using sense amp circuits.

Continuing design efforts are directed toward increasing memory density in semiconductor products, by decreasing the size of the cells. In constructing ferroelectric memory cells, the plateline and wordline signals, as well as the bitlines need to be routed to the appropriate terminals of the cell transistor and capacitor. In a 1T-1C cell, the ferroelectric capacitor is connected between a source/drain of the cell transistor and the plateline signal. The other transistor source/drain is connected to a bitline and the gate is connected to the wordline signal. The configuration of the cell components and interconnect routing structures plays a role in reducing the cell size in an array.

One layout architecture is referred to as 'capacitor under bitline', wherein the bitline is routed in an interconnect layer above the level at which the ferroelectric capacitor is formed. The capacitor under bitline architecture is preferred for many high-density memories, including embedded memories. For embedded memories, FRAM processing is performed following standard logic front end processing (e.g., after contact formation in an initial interlevel or interlayer dielectric layer (ILD0)) and before back end processing (e.g., prior to fabrication of metal interconnect layers). In the capacitor under bitline configuration, area must be dedicated to routing the bitline connection from the underlying transistor source/drain to the interconnect layer at which the bitline routing structures are created. This requires a bitline contact/via structure which passes through the ferroelectric capacitor level. For planar ferroelectric memory cells of small dimensions (e.g., areas below about 0.25 um$^2$), the size of the ferroelectric capacitor begins to control the cell size. Consequently, reducing the cell area is facilitated by maximizing the ferroelectric capacitor area.

A portion of a conventional open-bit ferroelectric memory array cell layout is illustrated in a device 2 in FIGS. 1A–1D. FIG. 1A provides a sectional side view of the device 2 taken along lines 1A—1A in FIGS. 1B–1D, which provide sectional top views of the device 2 along lines 1B—1B, 1C—1C, and 1D—1D, respectively, of FIG. 1A. The device 2 includes a silicon substrate 4 in which transistor source/drains 6 and isolation structures 8 are formed, and polysilicon gate structures 10 formed over channel regions of the substrate 4. MOS type cell transistors are thus formed by the gates 10 and the source/drains 6, wherein the source/drains 6 are formed by doping portions of active regions 12 in the substrate (FIG. 1B), and wherein some of the source/drains 6 are shared between adjacent transistors. A first interlevel or interlayer dielectric (ILD) layer 14 is formed over the transistors and the substrate 4, through which conductive contacts 16 are formed. Ferroelectric capacitors C are formed over the dielectric layer 14, including upper and lower electrodes or plates 18 and an interlying ferroelectric material 20.

As seen in FIGS. 1A and 1C, a second dielectric layer 22 overlies the capacitors C and the first dielectric 14, and conductive via structures 24 are formed therethrough to couple the upper capacitor plates 18 and the contacts 16 of the first layer. A third dielectric layer 26 is formed over the preceding dielectric 22, and a first layer of metal interconnect structures (M1) are formed therein, including conductive plateline routing structures 28 and landing pads 30 for the bitline connections. Bitline connection vias 32 are formed through the dielectric 26 to connect the landing pads 30 with a bitline structure 34 in a second metalization layer M2 in a succeeding ILD layer 36. As seen in FIG. 1C, there is a minimum distance 38 between the capacitor C and the bitline via 24 at the capacitor level in the ILD layer 22. While the conventional cell layout in the device 2 is simple for the transistors (e.g., straight gate structures 10, rectangular active regions 12), the capacitor efficiency or space utilization is limited because of all of the empty space required to place the bitline vias 24 between capacitors C. As the semiconductor industry continues the trend toward providing higher and higher memory densities, there remains a need for improved ferroelectric memory cells and methods for fabricating ferroelectric memory by which capacitor space utilization efficiency can be increased.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to ferroelectric memory devices and fabrication methods therefor in which bitline structures are positioned at the corners of the ferroelectric capacitors for coupling cell transistors with bitline routings in interconnect layers formed above the capacitors. The invention may be employed to facilitate reduction in cell area and/or increased capacitor area utilization in ferroelectric memories of any array architecture. The capacitor structures may be of any shape having lateral sides and at least one corner between two lateral sides, wherein the conductive bitline structures pass through the capacitor level or layer proximate the capacitor corners.

In one implementation, the capacitor corners are notched or recessed to improve space utilization in the presence of feature rounding caused by photolithographic fabrication processing. This allows the sizing of the conductive bitline and capacitor structures to be optimized with respect to capacitor utilization while adhering to fabrication process margins and design rules. Another feature of the invention provides for tabs or protrusions extending outward from a longitudinal side of the active region at the transistor source/drain to which the bitline connection is to be made. This facilitates reduction in the overall ferroelectric memory cell area. In addition, the invention provides for staggered wordline structures, such as the polysilicon gate structures of the cell transistors, in order to further facilitate cell area minimization.

In another aspect of the invention, methods are provided for fabricating ferroelectric memory cells in a semiconductor device, comprising forming a transistor in a semiconductor body, coupling the transistor gate to a conductive wordline structure, and forming first and second conductive structures in a first dielectric layer to couple the transistor source/drains. A ferroelectric capacitor structure is formed above the first dielectric layer and a second dielectric is formed over the capacitor structure. The method further comprises forming a conductive bitline via or contact structure through the second dielectric near a corner of the capacitor to couple the bitline connection from one of the transistor source/drains to a conductive bitline in an overlying interconnect layer.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIG. 4A is a partial top plan view in section illustrating a portion of another exemplary ferroelectric memory device wherein conductive bitline via structures are located proximate to corners of ferroelectric capacitor structures, wherein polysilicon wordline structures are staggered, and wherein transistor active regions include tab regions proximate bitline contacts or vias in accordance with further aspects of the invention;

FIG. 4B is a partial top plan view in section illustrating another portion of the exemplary ferroelectric memory device of FIGS. 4A–4G, wherein corners of the ferroelectric capacitor structures are indented near the bitline contacts or vias;

FIG. 4C is a partial top plan view in section illustrating another portion of the exemplary ferroelectric memory device of FIGS. 4A–4G;

DETAILED DESCRIPTION OF THE INVENTION

Figure 1A:
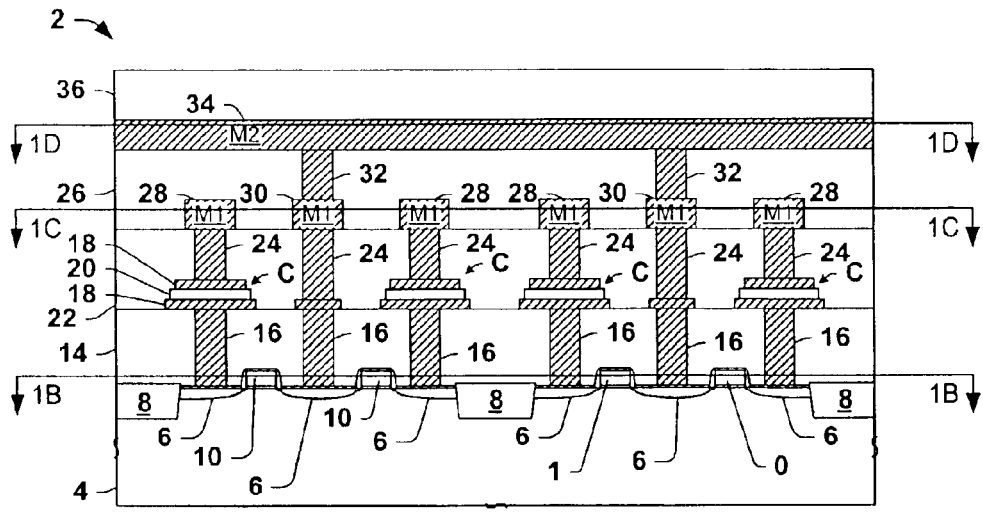
FIG. 1A is a partial side elevation view in section illustrating a portion of a conventional ferroelectric memory device.
Figure 1B:
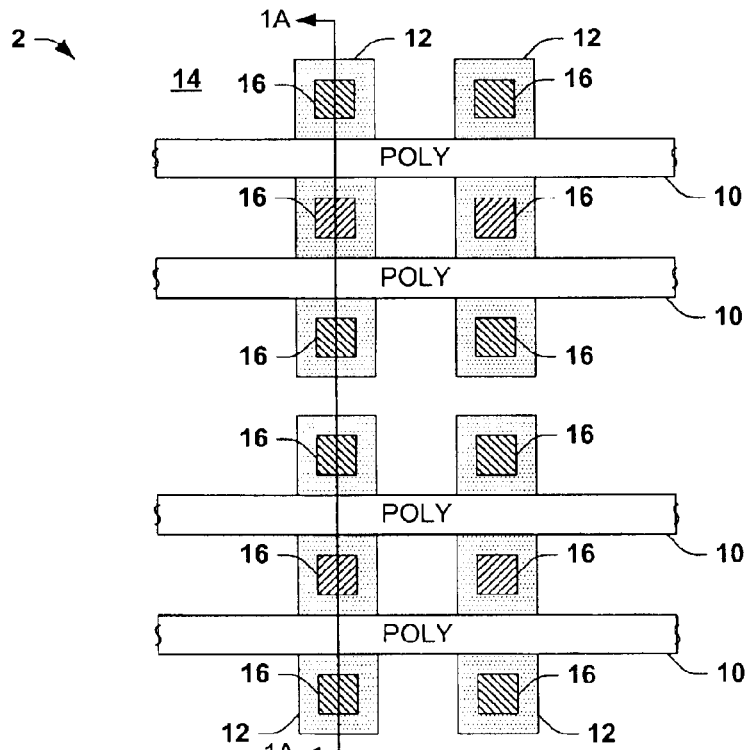
FIG. 1B is a partial top plan view of the device in section taken along line 1B—1B of FIG. 1A.
Figure 1C:
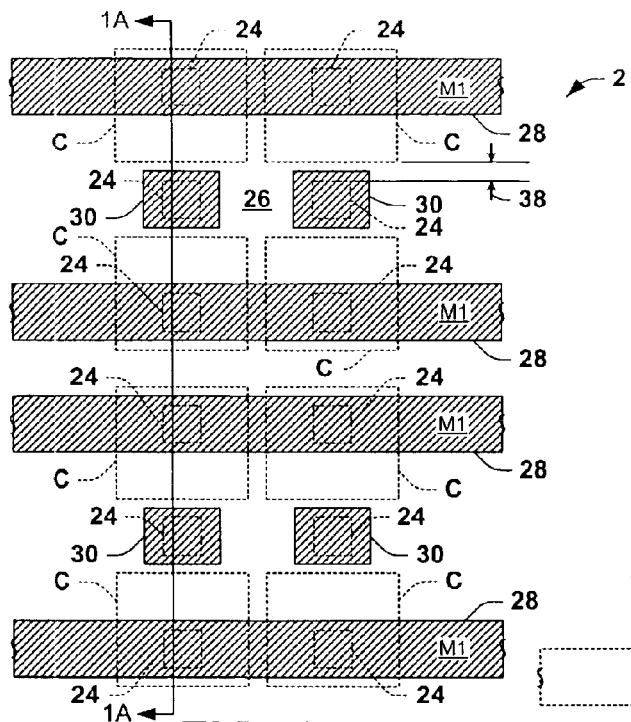
FIG. 1C is a partial top plan view of the device in section taken along line 1C—1C of FIG. 1A.
Figure 1D:
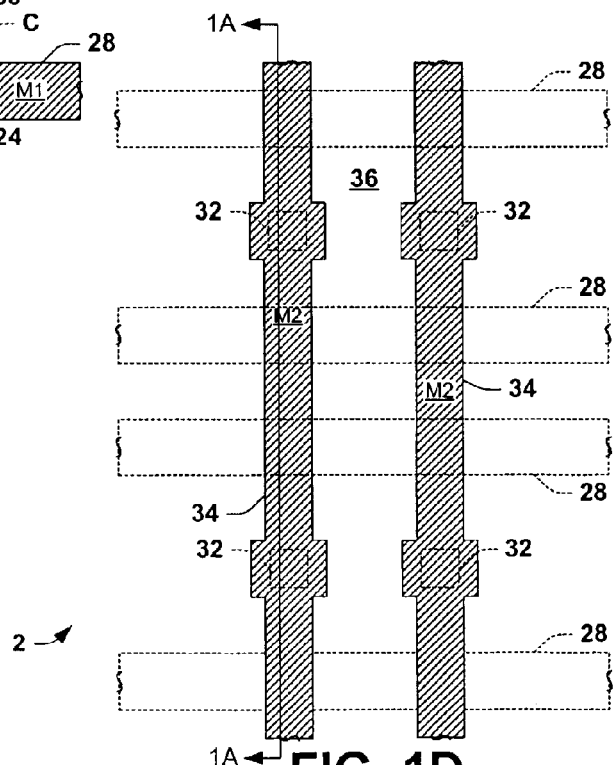
FIG. 1D is a partial top plan view of the device in section taken along line 1D—1D of FIG. 1A.

The present invention will now be described with reference to the attached drawings, wherein like reference numerals are used to refer to like elements throughout. The invention relates to semiconductor devices and methods in which ferroelectric device cells are formed with an interlayer bitline connection located near a corner of a cell capacitor. The various aspects of the invention are hereinafter illustrated and described in the context of exemplary semiconductor devices and memory arrays therefor, in which ferroelectric capacitors are formed in a dielectric layer or level after front-end contact formation prior to formation of overlying interconnect levels or layers. However, the various aspects of the invention may be employed at other points a fabrication process, for example, wherein the ferroelectric capacitors and bitline routing structures are individually formed at any level in a multi-level semiconductor device design, with bitline signals being routed through the capacitor level. In addition, the invention is applicable to any cell architecture, including but not limited to 1T-1C and 2T-2C cell structures, as well as to any array architecture, including but not limited to open-bitline and folded-bitline configurations. Furthermore, the invention may be employed in association with memory cell capacitors formed using any type of ferroelectric materials and with any form of cell transistor. In this regard, the invention is not limited to the examples illustrated and described herein, and all variant implementations are contemplated as falling within the scope of the present invention and the appended claims.

Figure 2A:
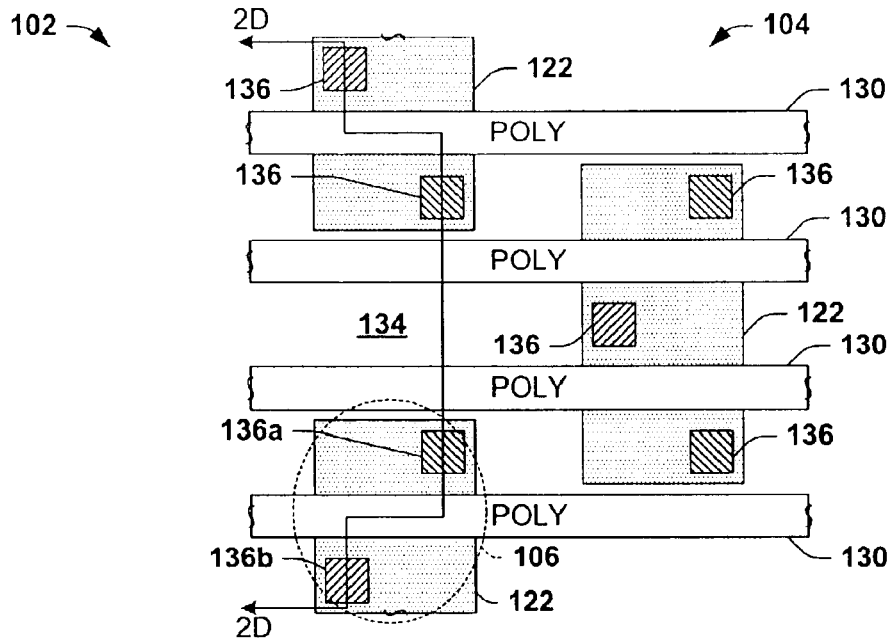
FIG. 2A is a partial top plan view in section taken along line 2A—2A of FIG. 2D illustrating a portion of an exemplary ferroelectric memory device in accordance with the present invention.
Figure 2B:
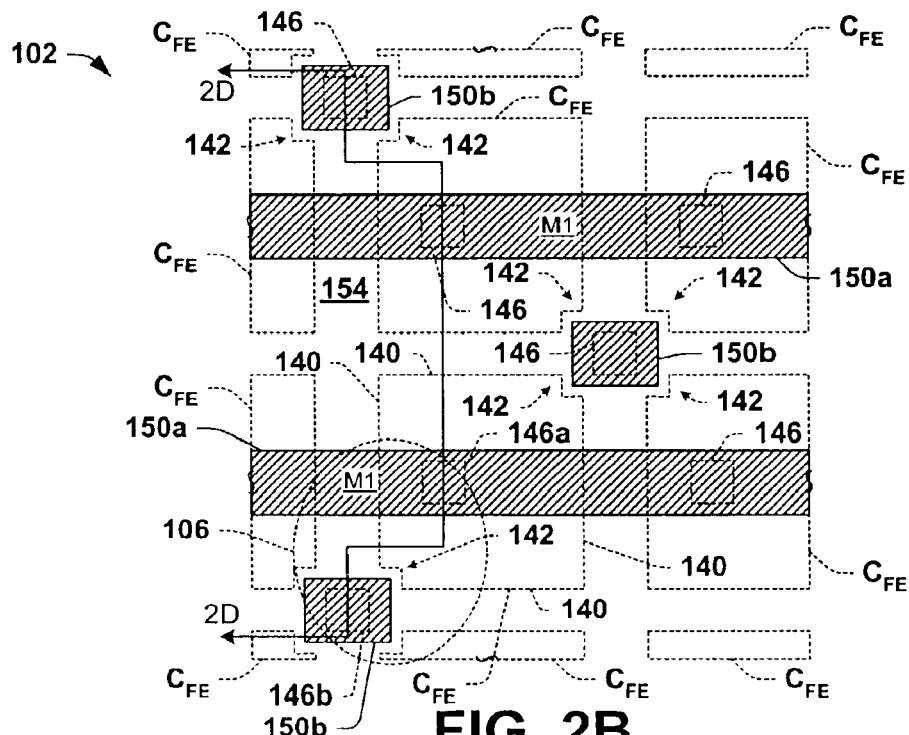
FIG. 2B is a partial top plan view in section taken along line 2B—2B of FIG. 2D illustrating another portion of the device of FIGS. 2A–2F wherein conductive bitline via structures are located proximate to corners of ferroelectric capacitors.
Figure 2C:
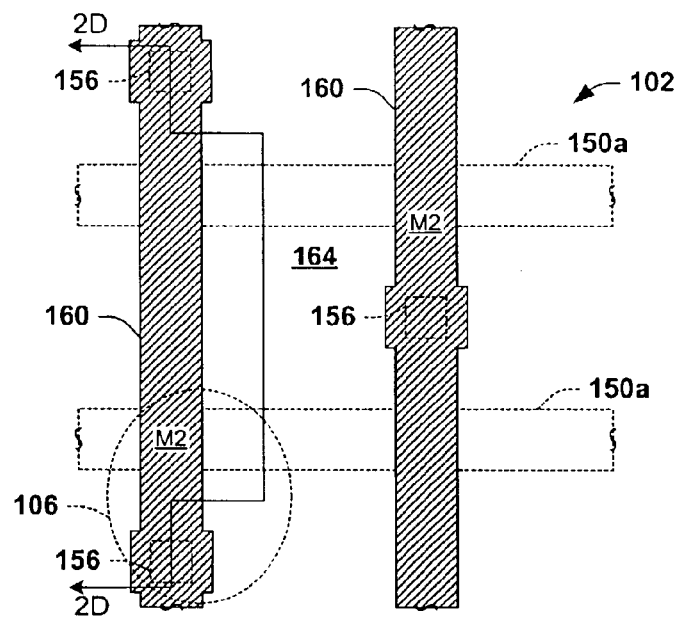
FIG. 2C is a partial top plan view in section taken along line 2C—2C of FIG. 2D illustrating another portion of the device of FIGS. 2A–2F.
Figure 2D:
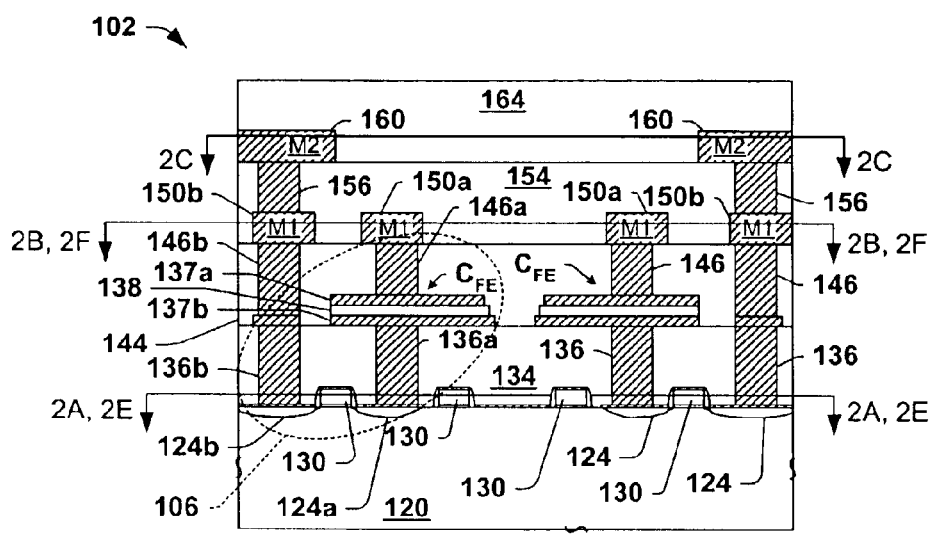
FIG. 2D is a partial side elevation view in section taken along lines 2D—2D of FIGS. 2A–2C further illustrating the device of FIGS. 2A–2F.
Figure 2E:
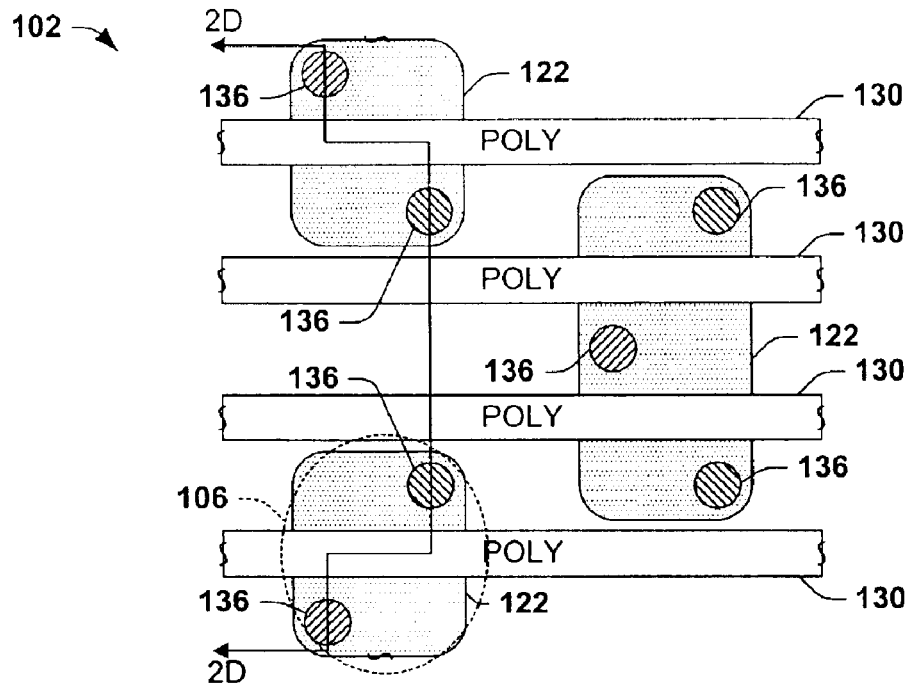
FIG. 2E is a partial top plan view in section taken along line 2E—2E of FIG. 2D illustrating feature rounding of active regions and conductive contact structures in the device of FIGS. 2A–2F.
Figure 2F:
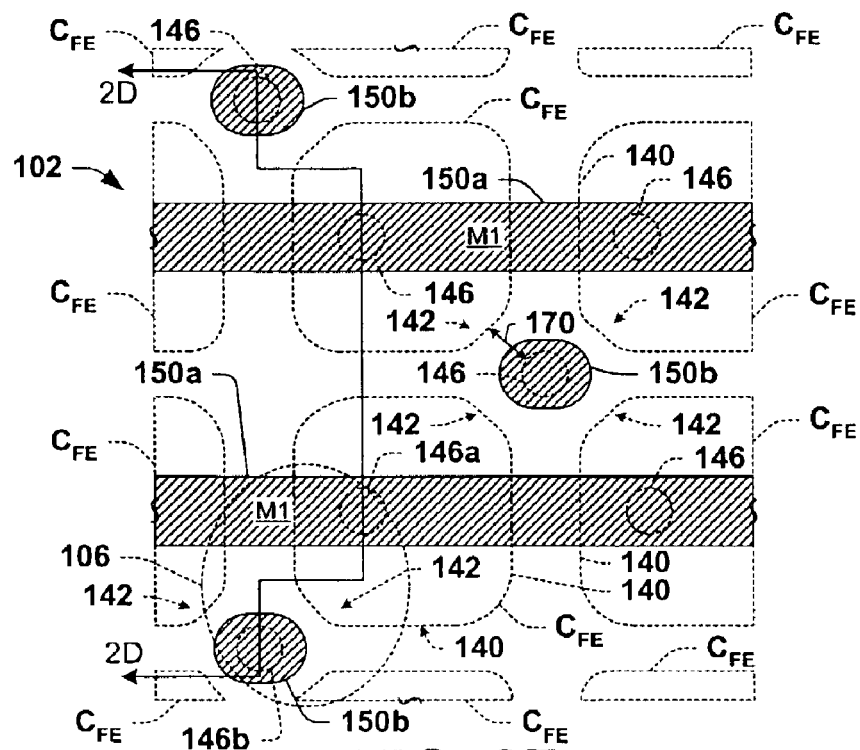
FIG. 2F is a partial top plan view in section taken along line 2F—2F of FIG. 2D further illustrating feature rounding of ferroelectric capacitor structures and bitline via structures in the device of FIGS. 2A–2F.
Figure 2G:
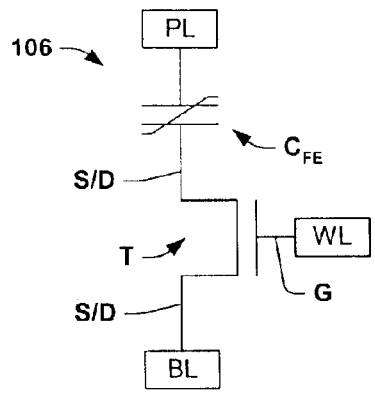
FIG. 2G is a schematic diagram illustrating an exemplary 1T-1C ferroelectric memory cell in the device of FIGS. 2A–2F.
Figure 2H:
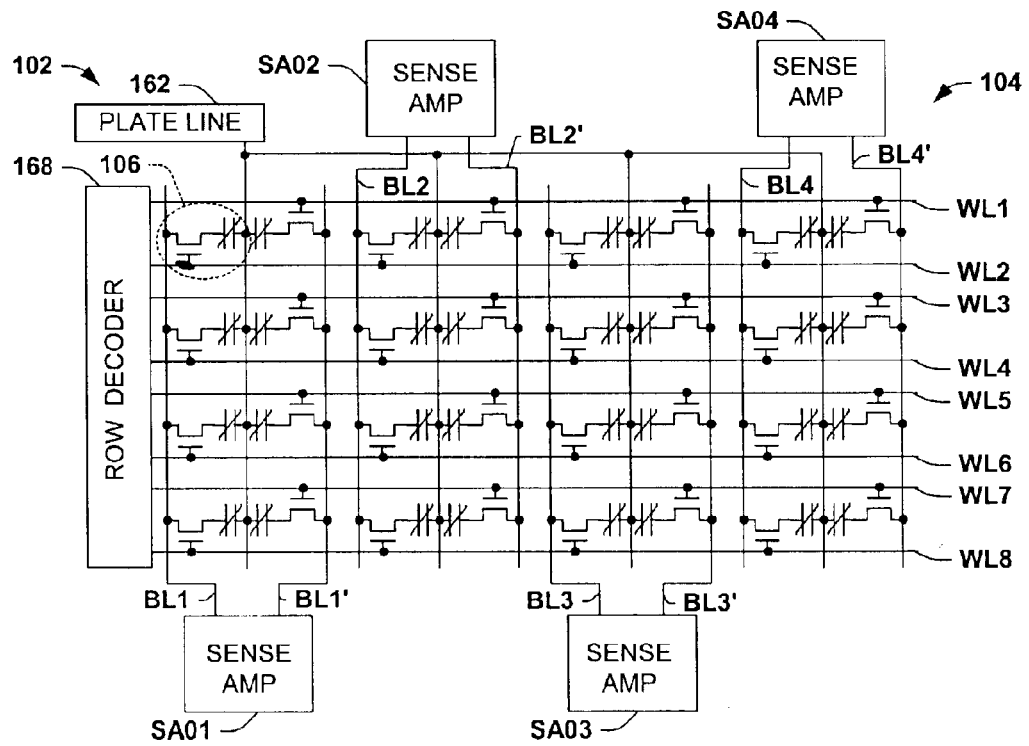
FIG. 2H is a schematic diagram illustrating an exemplary ferroelectric memory array in accordance with the present invention.

Referring initially to FIGS. 2A–2H, a portion of an exemplary semiconductor device 102 is illustrated, which comprises an array 104 of 1T-1C ferroelectric memory cells 106. The device 102 and other devices herein are illustrated in simplified form for purposes of illustrating the various aspects of the invention, wherein the structures are not necessarily drawn to scale, and wherein the structures generally may be fabricated using any semiconductor processing techniques. As seen in FIG. 2G, the individual cells 106 comprise a MOS transistor T having first and second source/drains S/D and a gate G, as well as a ferroelectric capacitor $C_{FE}$. The cell transistor gate G is coupled with a wordline WL and a first source/drain is coupled with a bitline BL. A first capacitor electrode or plate is coupled with a plateline PL and the second capacitor plate is coupled with a second transistor source/drain. FIG. 2D illustrates a side sectional view of a portion of the device 102 taken along lines 2D—2D in FIGS. 2A–2C, and FIGS. 2A–2C illustrate sectional top views of the device 102 taken along section lines 2A—2A, 2B—2B, and 2C—2C, respectively, in FIG. 2D. FIG. 2H illustrates an example of a folded bitline array configuration in the device 102.

As seen in FIGS. 2A and 2D, the device 102 comprises a semiconductor body 120, such as a silicon wafer or an SOI wafer, with active regions 122 therein. Transistor source/drains 124 (FIG. 2D) are formed in the active regions 122, wherein some of the source/drains 124 are shared between adjacent transistors in the array 104. Polysilicon gate structures 130 are formed over channel regions of the substrate 104 between the source/drains, wherein cell transistors are formed by the gates 130 and the source/drains 124. A first interlevel or interlayer dielectric (ILD) layer 134 (ILD0) is formed over the transistors and the semiconductor body 120, and ILD0 contacts 136 are formed through the ILD0 layer 134, which may be formed of any conductive material or materials, such as tungsten or the like.

Ferroelectric capacitor structures $C_{FE}$ are formed over the first dielectric layer 134, where the ferroelectric capacitors $C_{FE}$ individually comprise an upper or first conductive capacitor plate or electrode 137a and a second or lower electrode 137b, as well as a ferroelectric material 138 formed between the electrodes 137. The capacitor electrodes 137 may be formed of any suitable material or combination of multiple layers of materials, for example, wherein a diffusion barrier is first created comprising TiN formed over the interlayer dielectric 134 and the tungsten contact 136 via chemical vapor deposition (CVD) with a TiAlN film or a TiAlON being deposited using a physical vapor deposition (PVD) or other process. The bottom electrode material 137b may then be formed over the diffusion barrier, for example, comprising any conductive material such as Pt, Pd, PdOx, IrPt alloys, Au, Ru, $RuO_x$, $(Ba,Sr,Pb)RuO3$, $(Sr,Ba,Pb)IrO3$, Rh, $RhO_x$, $LaSrCoO_3$, $(Ba,Sr)RuO_3$, $LaNiO_3$, etc., or any stack or combination thereof.

Ferroelectric material 138 is then deposited using any appropriate deposition techniques such as metal organic chemical vapor deposition (MOCVD) using any suitable ferroelectric materials, including but not limited to Pb(Zr,Ti)$O_3$ PZT (lead zirconate titanate), doped PZT with donors (Nb, La, Ta) acceptors (Mn, Co, Fe, Ni, Al) and/or both, PZT doped and alloyed with $SrTiO_3$, $BaTiO_3$ or $CaTiO_3$, strontium bismuth tantalate (SBT) and other layered perovskites such as strontium bismuth niobate tantalate (SBNT) or bismuth titanate, $BaTiO_3$, $PbTiO_3$, $Bi2TiO_3$, etc. The top electrode material 137a may be a single layer or a multilayer conductive structure such as $IrO_x$, $RuO_x$, $RhO_x$, $PdO_x$, $PtO_x$, $AgO_x$, $(Ba,Sr)RuO_3$, $LaSrCoO_3$, $LaNiO_3$, $YBa_2Cu_3O_{7-x}$ with a noble metal layer thereover, wherein the layers 137b, 138, and 137a may be formed to any desired thickness in accordance with the invention.

The capacitor material layers are then patterned to define the ferroelectric capacitor structures $C_{FE}$ (FIGS. 2B and 2D), wherein the capacitors $C_{FE}$ comprise lateral sides 140 (FIG. 2B) and corners 142 between the sides 140. Referring particularly to the cell 106 circled in dashed line in FIGS. 2A–2F, the first dielectric layer 134 (ILD0) includes first and second conductive contacts 136a and 136b, respectively, wherein the first contact 136a structure electrically couples the lower capacitor electrode 137b with a first source/drain 124a of the cell transistor. The second conductive ILD0 contact structure 136b couples a second source/drain 124b to the overlying capacitor level or layer, which serves to connect the cell 106 with a bitline for reading and writing data.

A second dielectric layer 144 (ILD1) is formed over the first dielectric layer 134 and over the ferroelectric capacitor structures $C_{FE}$. Conductive ILD1 via structures 146 are formed in the ILD1 dielectric layer 144, wherein the vias 146 may be formed using standard damascene or other interconnect processing techniques, using copper with suitable diffusion barrier layers or other conductive materials. A third dielectric layer 154 (ILD2) is formed over ILD1 dielectric 144 and over the vias 146, and a first metal layer structure 150 (M1) is formed and patterned to provide conductive plateline routing structures 150a and landing pads 150b for the bitline connections. With respect to the exemplary (e.g., circled) cell 106, a first ILD1 via 146a couples the upper capacitor electrode 137a with the plateline structure 150a and the second ILD1 via couples the bitline connection from the second source/drain 124b to a landing pad 150b. ILD2 vias 156 are then formed in the third dielectric layer 154 for coupling to the bitline landing pads 150b.

A fourth dielectric layer 164 (ILD3) is then formed over the ILD2 layer 154 and the vias 156 and conductive bitline routing structures 160 are formed therein, as shown in FIGS. 2C and 2D, wherein the bitline structure 160 corresponding to the exemplary cell 106 couples with the second source drain 124b through the ILD0 contact 136b, the ILD1 via 146b, the ILD2 landing pad 150b, and the ILD2 via 156. The various interlayer or interlevel dielectric layers of the device 102 are illustrated in simplified form, wherein one or all of these layers may individually comprise multiple dielectric layers, and wherein the interconnect structures and other conductive structures may be formed using single or dual damascene processing techniques or any other suitable methods for fabricating conductive interconnect structures isolated from one another by dielectric material.

As seen in FIG. 2B, the individual conductive bitline structures, particularly the ILD1 vias 146*b*, pass near the corners 142 of the capacitor structures $C_{FE}$, so as to allow a minimum spacing distance therebetween in the capacitor layer or level. This facilitates maximizing the capacitor size relative to the cell area and/or facilitates reduction in the cell area for increasing ferroelectric memory cell density in the device 102. In the illustrated device, moreover, the capacitor structure corners 142 are notched or recessed. Any location of the conductive bitline structures proximate or near to the capacitor corner is contemplated within the scope of the invention, wherein the bitline structure is located closer to the corner 142 than to the lateral capacitor sides 140, wherein the ferroelectric capacitor structures may, but need not, be generally rectangular. In this regard, the capacitor structures and the conductive bitline structures may be of any size and shape within the scope of the invention and the appended claims, wherein the capacitors have at least one corner.

Figure 2I:
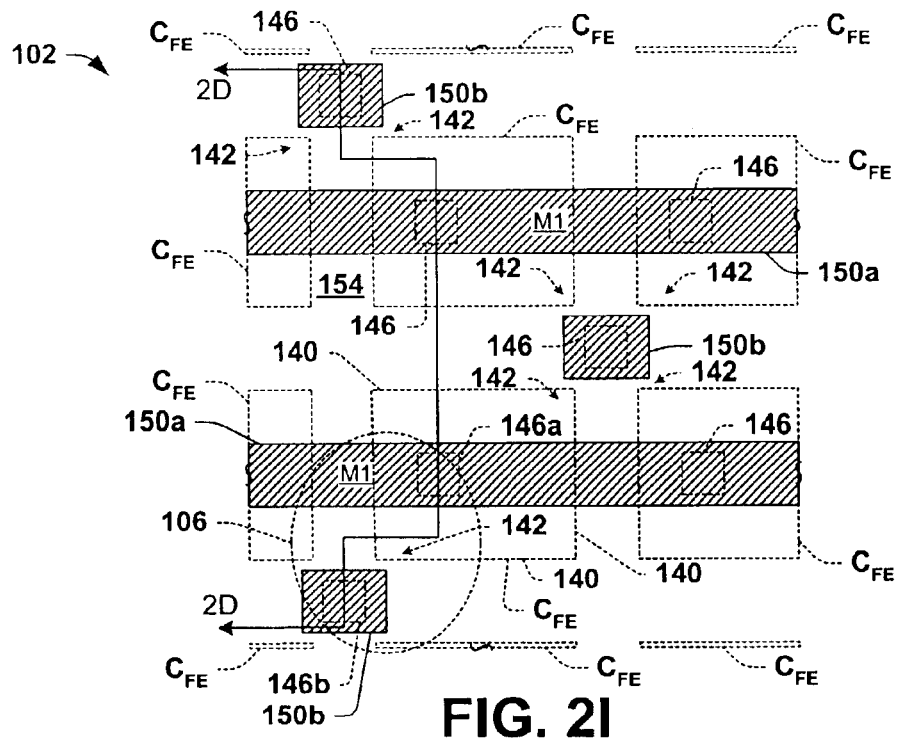
FIG. 2I is a partial top plan view in section taken along line 2B—2B of FIG. 2D illustrating another portion of the device of FIGS. 2A–2F wherein conductive bitline via structures are located proximate to corners of ferroelectric capacitors, in which the capacitor corners are not notched.
Figure 2J:
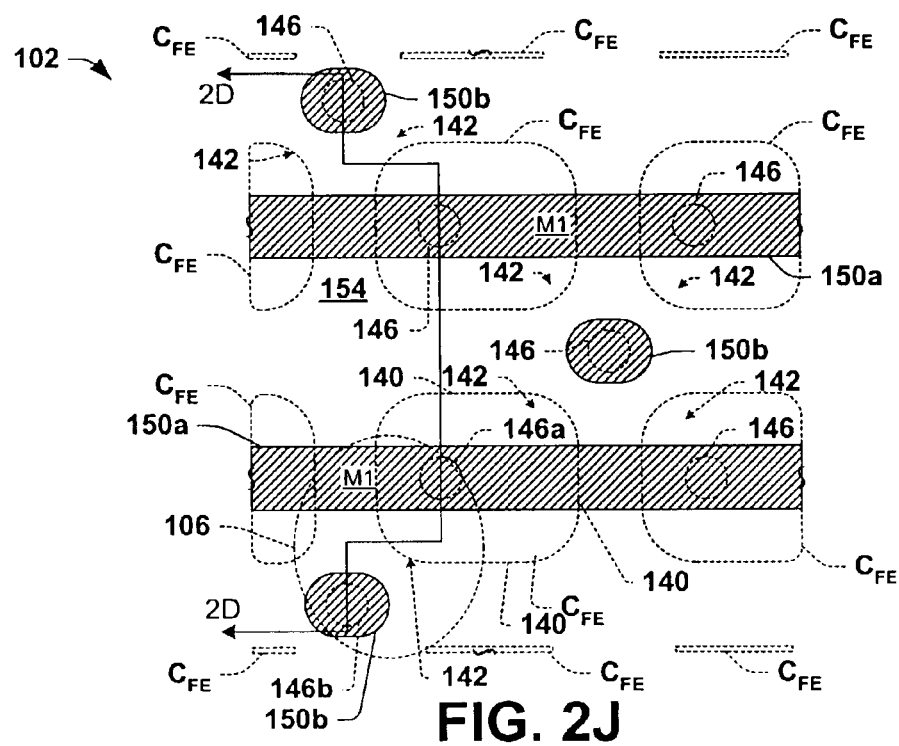
FIG. 2J is a partial top plan view in section taken along line 2B—2B of FIG. 2D illustrating feature rounding of active regions and conductive contact structures in the device of FIGS. 2A–2F where the capacitor corners 142 are not notched.

Referring also to FIGS. 2E and 2F, the inventor has appreciated that lithographic fabrication processing in forming the various structures may result in feature rounding. This effect is illustrated for two levels of the exemplary device 102, wherein the conductive contacts 136 and the active regions 122 are rounded (FIG. 2E), together with the capacitor structures $C_{FE}$, the conductive bitline landing pads 150*b* in ILD2 154, and the conductive bitline vias 146*b* (FIG. 2F) passing near the capacitor corners 142. As illustrated in FIG. 2F, the notching of the corners 142 near the bitline vias 146 allows control of a distance 170 therebetween such that the capacitor structures $C_{FE}$ and the vias 146 may be designed for minimizing cell area and/or for maximizing capacitor area relative to cell area. Depending on lithography and other process constraints, notches in the corners of the capacitor (e.g., notches 142) are not needed. In this regard, FIGS. 2I and 2J illustrate a portion of the device 102 taken along line 2B—2B of FIG. 2D (with and without feature rounding, respectively) illustrating another portion of the device of FIGS. 2A–2F, wherein conductive bitline via structures are located proximate the corners 142 of the ferroelectric capacitors $C_{FE}$, and where the capacitor corners 142 are not notched. Thus, the invention is not limited to capacitor structures having recessed or notched corners, wherein any shape of capacitor structure corner is contemplated as falling within the scope of the invention and the appended claims.

The exemplary semiconductor device 102 and other devices illustrated and described herein provide for location of the conductive bitline structures near the corners of the ferroelectric capacitor structures by locating the bitline source/drain generally beneath the capacitor corner (e.g., with generally vertical contacts and/or vias therebetween). However, any implementation is possible within the scope of the invention, wherein the bitline structure passes through the capacitor layer or level proximate the capacitor corner. For example, the bitline may be routed laterally between the source/drain and the capacitor level so as to pass through the capacitor layer near the capacitor corner or corners within the scope of the invention and the appended claims. In the regard, the invention and the claims are not limited to implementations where the capacitor is directly above a transistor source/drain and do not require that the conductive bitline structure pass through the capacitor layer directly above a transistor source/drain.

As shown in FIG. 2H, the cells 106 in the exemplary device 102 may be configured in a folded bitline array 104 in which rows of data along wordlines WL1–WL8 may be read and written in a single memory access operation using complementary bitline pairs BL1/BL1'–BL4/BL4' organized along array columns. A plateline signal 162 is selectively provided by control circuitry (not shown) to one terminal of the cell capacitors being accessed, wherein the other side of the capacitors $C_{FE}$ are connected to one of the bitlines BL1/BL1'–BL4/BL4' through the associated cell transistor T. The cell transistors T are gated by the wordline signals WL1–WL8 provided by a row decoder circuit 168. Differential sense amps SA01–SA04 are located at the ends of the illustrated column portions with inputs coupled to the complementary bitline pairs BL1/BL1'–BL4/BL4'.

In accessing the cells 106 in the array 104, reading and writing is performed in a row-wise fashion, wherein the decoder 168 selects a desired row based on address information (not shown), and accordingly asserts one of the wordlines WL1–WL8. In a write operation, the sense amps SA01–SA04 provide a differential voltage across the bitline pairs BL1/BL1'–BL4/BL4', wherein the polarities of the differential voltages are representative of write data to be stored in the row of cells 106 being accessed. A plateline signal 162, such as a low-high-low pulse is applied to the array 104, so as to create a voltage potential across the ferroelectric capacitors of the cells 106 being accessed. The resulting electric field in the ferroelectric material of the accessed cell capacitors provides polarization of dipoles therein, by which a known, non-volatile memory cell data state is established in each of the accessed cells 106.

In a read operation, the decoder 168 again selects the row of interest by asserting one of the wordlines WL1–WL8, and the plateline signal 162 is again applied to the array 104. This connects the accessed cell capacitors between the plateline voltage 162 and one of the complementary bitlines, with the other bitline being held at a reference voltage level. The sense amps SA01–SA04 sense differential voltages across the complementary bitline pairs BL1/BL1'–BL4/BL4', which correspond to the memory cell data states prior to the read operation. The data states may then be transferred to IO buffer circuitry (not shown), and are then refreshed back into the memory cells 106. Other array configurations are possible within the scope of the invention, including but not limited to open-bitline architectures and others.

Figure 3:
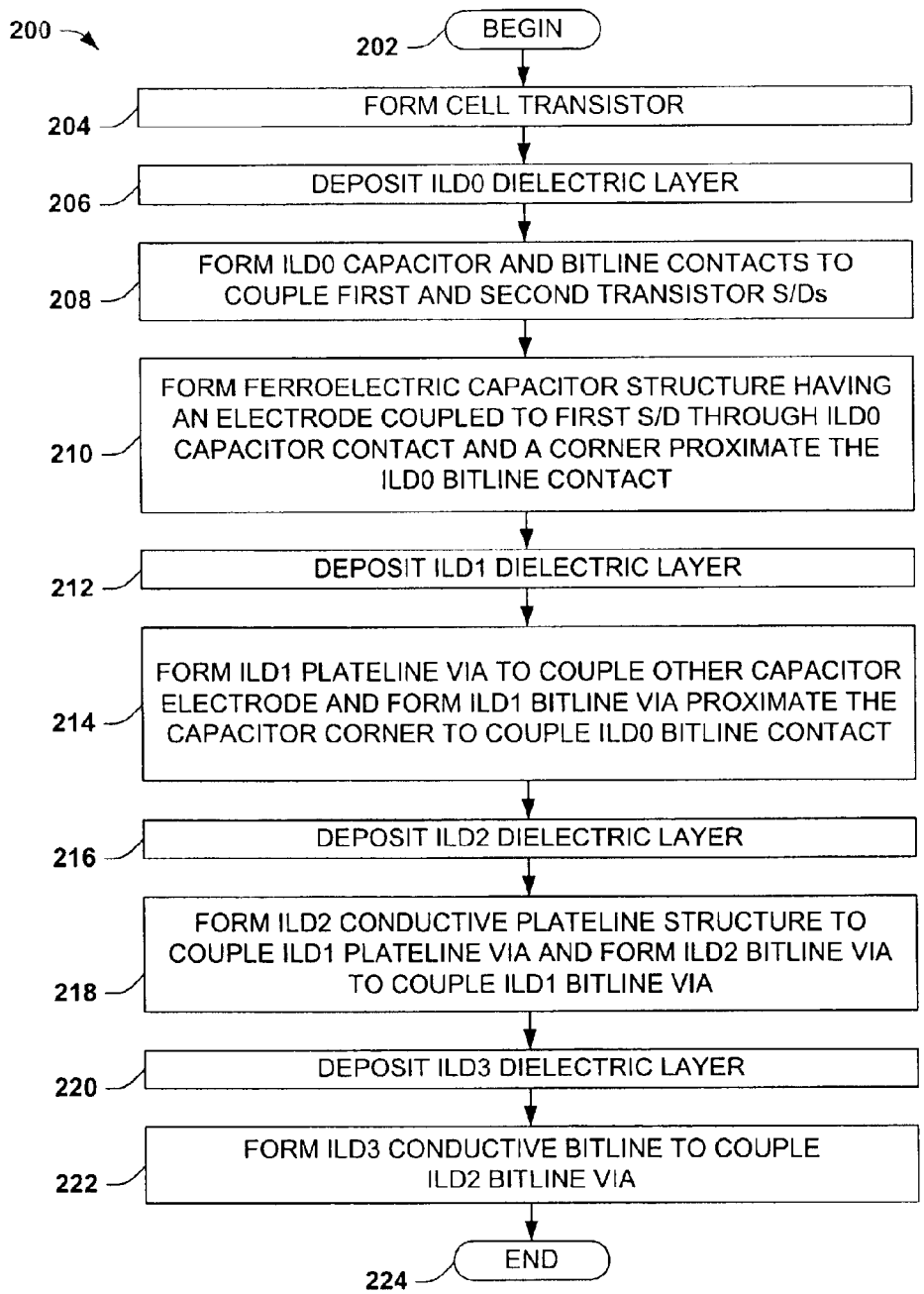
FIG. 3 is a flow diagram illustrating an exemplary method of fabricating a ferroelectric memory cell in accordance with another aspect of the invention.

FIG. 3 illustrates an exemplary method 200 for fabricating a ferroelectric memory cell in a semiconductor device for a capacitor under bitline architecture in accordance with the invention. Although the exemplary method 200 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of devices which are illustrated and described herein, as well as in association with other devices and structures not illustrated.

Beginning at 202, the method 200 comprises forming a cell transistor at 204, for example, in a silicon, SOI, or other semiconductor body, where the transistor comprises first and second source/drains formed in an active region of the semiconductor body and a gate formed over a channel region of the semiconductor body, and where the gate is coupled to a conductive wordline structure. A first dielectric layer (e.g., ILD0) is formed at 206 over the transistor and the semiconductor body, and first and second conductive structures are formed in the first dielectric layer at 208, for example, tungsten ILD0 contacts. The first conductive structure in this example is used to couple a first transistor source/drain with a subsequently formed ferroelectric cell capacitor and the second conductive structure is employed to couple with the second source/drain.

At 210, a ferroelectric capacitor structure is formed above the first dielectric layer, having first and second conductive electrodes and a ferroelectric material disposed therebetween. The second or lower conductive electrode is electrically coupled with the first conductive structure, for example, where the capacitor structure is formed over the contact coupled with the first transistor source/drain, as in the exemplary device 102 above. The capacitor formed at 210 also comprises at least one corner near the ILD0 bitline contact in this example. A second dielectric layer (e.g., ILD1) is formed at 212 over the first dielectric layer and over the ferroelectric capacitor structure. At 214, third and fourth conductive structures are formed in the second dielectric layer, such as an ILD1 plateline via and an ILD1 bitline via, where the ILD1 plateline via is electrically coupled with the first or upper capacitor electrode and the ILD1 bitline via is coupled with the ILD0 bitline contact. The ILD1 bitline via may be coupled to the ILD0 bitline contact through a conductive ILD1 landing pad or other conductive structures, wherein the ILD1 bitline via structure is proximate or near to at least one of the ferroelectric capacitor structure corners.

At 216, a third dielectric layer is formed, such as an ILD2 dielectric layer overlying the ILD1 material and the tops of the ILD1 vias. A conductive plateline structure is formed at 218 to couple the ILD1 plateline via, and a fifth conductive structure, such as an ILD2 bitline via is formed to couple with the ILD1 bitline via. A fourth dielectric layer is then formed at 220 over the third dielectric layer, such as an ILD3 dielectric, and a conductive bitline is formed therein at 222, which is coupled with the ILD2 bitline via, before the method 200 ends at 224. In this example, the ILD0 bitline contact, and the ILD1 and ILD2 bitline vias form a conductive bitline structure proximate the ferroelectric capacitor corner. While the exemplary method 200 provides for formation of the ferroelectric capacitor structure in a second ILD layer or level, the invention contemplates methods and devices in which the ferroelectric capacitor may be formed at any level, wherein a conductive bitline structure passing through the capacitor level is proximate at least one capacitor structure corner.

Figure 4D:
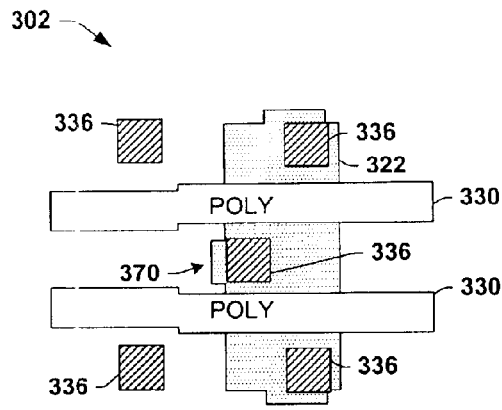
FIG. 4D is a partial top plan view in section illustrating further details of the staggered polysilicon wordline structures and the active regions in the device of FIGS. 4A–4G.
Figure 4E:
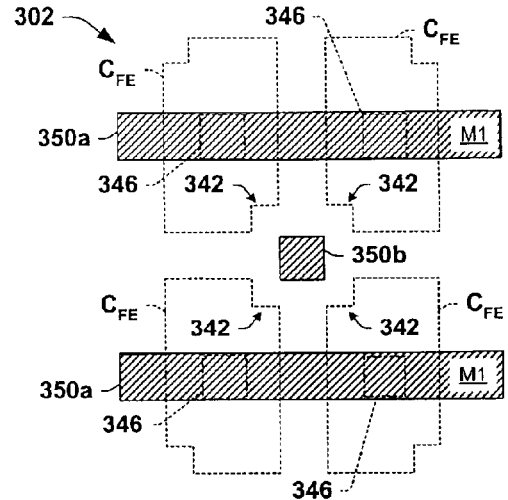
FIG. 4E is a partial top plan view in section illustrating further details of the ferroelectric capacitor and conductive bitline structures in the device of FIGS. 4A–4G.

In other aspects of the invention, the conductive wordline structures may be staggered, and the active regions may include a tab or protrusion in which the bitline source/drain is formed. Referring now to FIGS. 4A–4G, another exemplary semiconductor device 302 is illustrated and described hereinafter in accordance with the invention, wherein FIGS. 4A and 4D show sectional top views taken at the transistor gate level, FIGS. 4B and 4E show sections at an ILD2 level illustrating structures in a first metalization layer (e.g., M1), and FIG. 4C illustrates a section through an ILD3 level showing bitline metalization routing structures (e.g., M2). The device 302 comprises staggered polysilicon gate structures 330 formed over a semiconductor body, wherein the polysilicon structures 330 operate as conductive wordline structures along rows of ferroelectric memory cells. Cell transistor source/drains are formed in active regions 322 of the semiconductor body having tabs 370 (FIG. 4D) extending outwardly from longitudinal sides of the active regions 322, wherein the bitline source/drains are formed at least partially in the protrusions 370.

Referring also to FIGS. 4B and 4E, an ILD0 dielectric layer 334 and an ILD1 dielectric layer are formed over the semiconductor body, wherein conductive ILD0 contacts 336 couple the source/drains with ferroelectric capacitor structures $C_{FE}$ and bitline ILD1 vias 346 in the ILD1 layer. A third dielectric layer 354 (ILD2 in this example), is formed over the ILD1 dielectric and the contacts 346, and a first metalization level (M1) is formed, comprising conductive plateline structures 350a extending along the array rows, as well as ILD1 bitline landing pads 350b. Referring also to FIG. 4C, bitline vias 356 are formed to contact the landing pads 350b and a fourth dielectric layer 364 (ILD3) is then formed over the vias 356 and the ILD2 dielectric 354. Conductive bitline routing structures 360 are formed in ILD3 along array columns in the device 302.

Figure 4F:
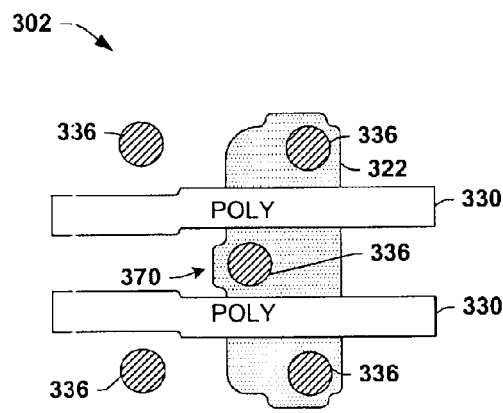
FIG. 4F is a partial top plan view in section illustrating rounding of the polysilicon wordline structures, contacts, vias, and active regions in the device of FIGS. 4A–4G.
Figure 4G:
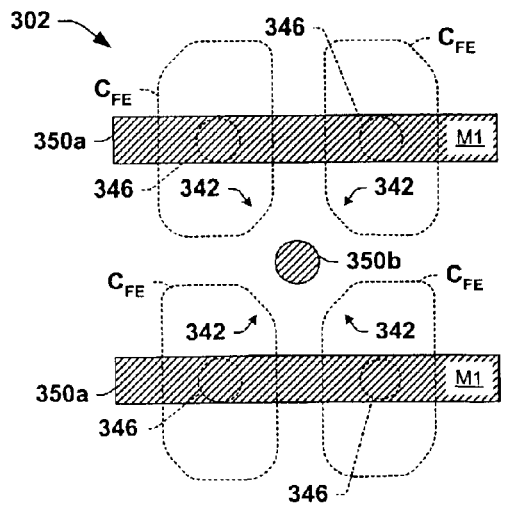
FIG. 4G is a partial top plan view in section illustrating rounding of the ferroelectric capacitor and conductive via structures in the device of FIGS. 4A–4G.

As shown in FIGS. 4D and 4E, the inventor has appreciated that staggering the polysilicon wordline structures 330 and providing the active region tabs or protrusions 370 facilitates reducing the overall cell area or size where the bitline vias 346 pass through the ILD1 layer near the ferroelectric capacitor structure corners. In the illustrated example of the device 302, the active regions 322 are reduced while including the protrusions 370 to reduce the amount of overlap between the active regions 322 and the ILD0 contacts 336, thereby facilitating cell area reduction in the direction along the array rows. Separately or in combination, the staggered polysilicon gate/wordline structures 330 may be employed to reduce the poly to poly spacing over field regions of the semiconductor body, which helps in reducing the cell size in the direction along the array columns. FIGS. 4F and 4G illustrate the cell arrangement of the device 302 where feature rounding occurs in lithographic fabrication process steps. The natural rounding of polysilicon wordlines 330 that occurs due to the lithography process will smooth out the structure of the polysilicon wordlines 330 and may inhibit or prevent the formation of wordline structures 330 having too narrow a polysilicon width.

Figure 5A:
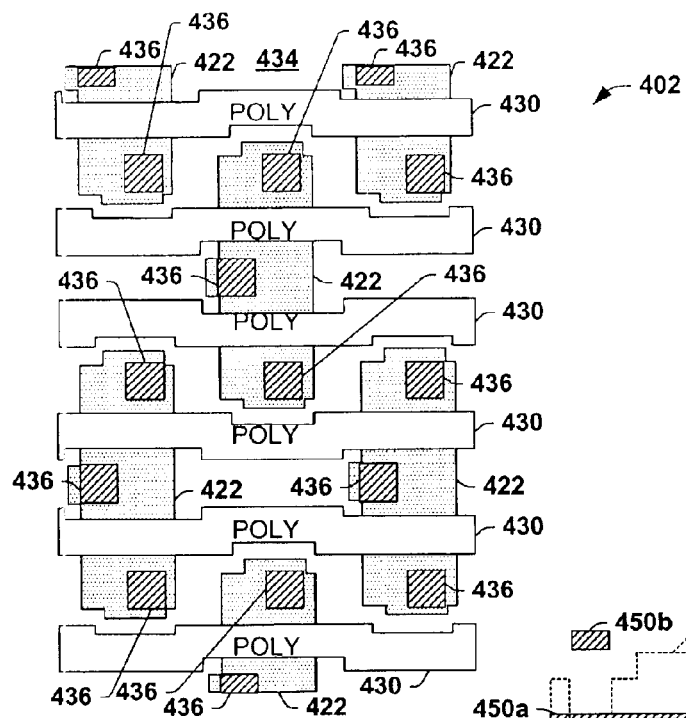
FIGS. 5A–5G illustrate another exemplary ferroelectric memory device in which conductive bitline structures are located proximate to ferroelectric capacitor corners in accordance with the invention.
Figure 5B:
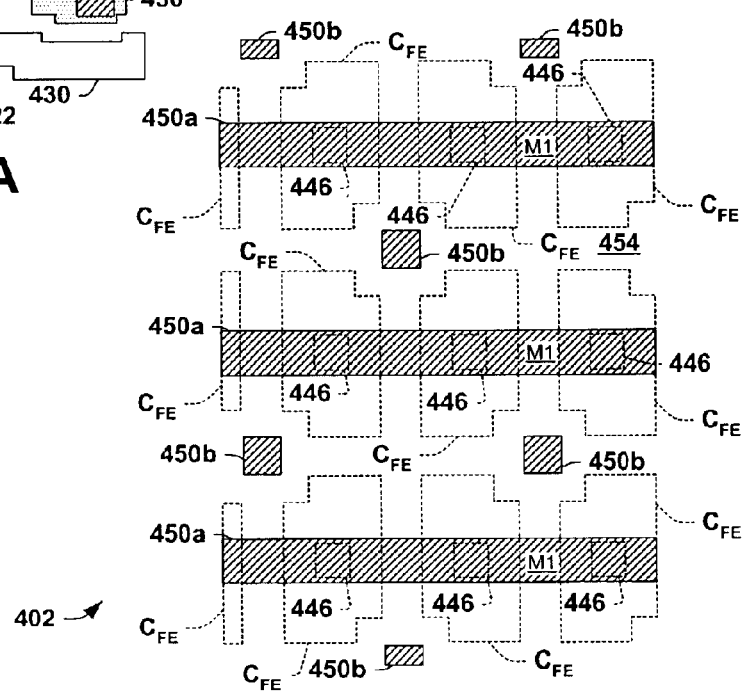
Figure 5C:
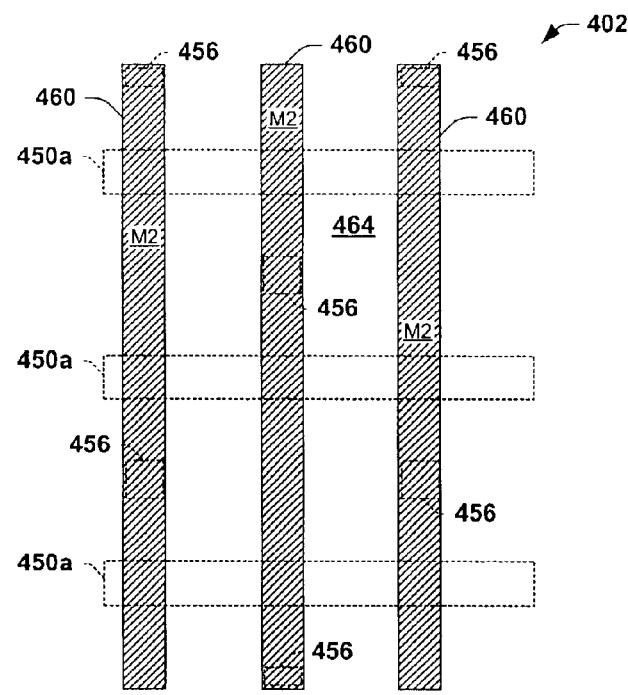
Figure 5D:
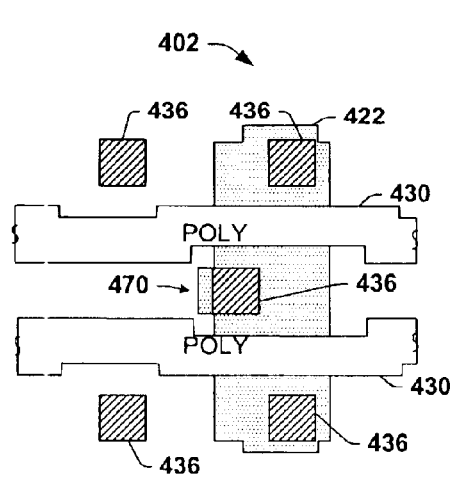
Figure 5E:
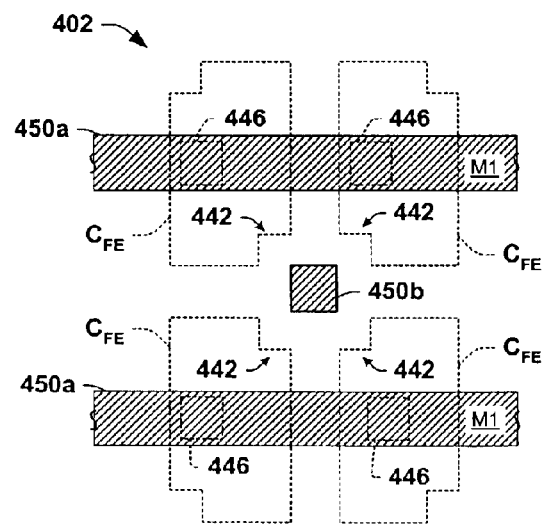

Another exemplary device 402 is illustrated in FIGS. 5A–5G, in which staggered polysilicon wordline structures 430 and active regions 422 with protrusions 470 are employed in accordance with the invention. FIGS. 5A and 5D provide top sectional views at the transistor gate level, FIGS. 5B and 5E show sections at an ILD2 level illustrating structures in a first metailzation layer (e.g., M1), FIG. 5C shows a section through an ILD3 level illustrating bitline metalization routing structures (e.g., M2), and FIGS. 5F and 5G further illustrate the device 402 in the presence of feature rounding. The staggered wordline structures 430 are formed as cell transistor gates over a semiconductor body, with transistor source/drains being formed in the active regions 422. The protrusions or tabs 470 (FIG. 5E) extend outwardly from longitudinal sides of the active regions 422, with the bitline source/drains being formed at least partially in the protrusions 470. The protrusions or tabs 470 on the active regions 422 allow the ferroelectric memory cells to be reduced while maintaining a sufficient active overlap to contacts 436 in an initial (e.g., ILD0) dielectric layer. The overlap provides a good distribution of contact resistances. In fabrication, the lithography process rounds both the contacts 436 (e.g., drawn square contacts look like a circles) and the active regions 422. Thus, the tabs or protrusions 470 may be advantageously employed to maintain the required active overlap between the active regions 422 and the ILD0 contacts 436 even where feature rounding occurs.

Although the exemplary implementations illustrated and described above involve ferroelectric memory structures in which the bitline conductive contacts are located near corners of four ferroelectric capacitor structures to couple a source/drain of the cell transistors to conductive bitline routing structures in interconnect layers formed above the ferroelectric capacitors, the invention is not limited to the illustrated example structures. In another possible implementation, the bitline contacts may be located near the corners of three ferroelectric capacitor structures, for example, in which one big capacitor is situated near two smaller ferroelectric capacitors, wherein the capacitor corners generally face one another at about 120 degree angles. In this regard, the invention contemplates placement of a bitline or other conductive structure passing through a ferroelectric capacitor layer (e.g., a dielectric layer or level in which the ferroelectric capacitors are formed) near at least one capacitor structure corner.

Figure 5F:
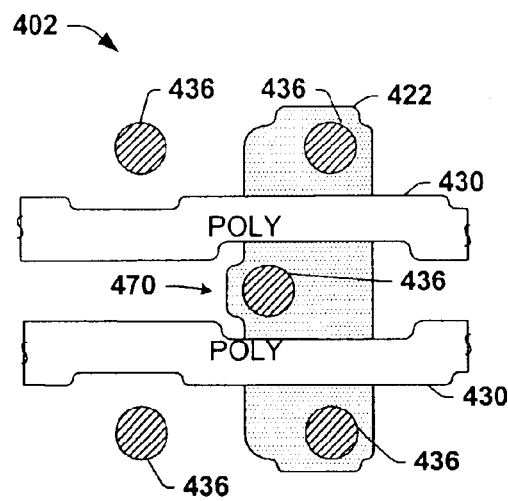
Figure 5G:
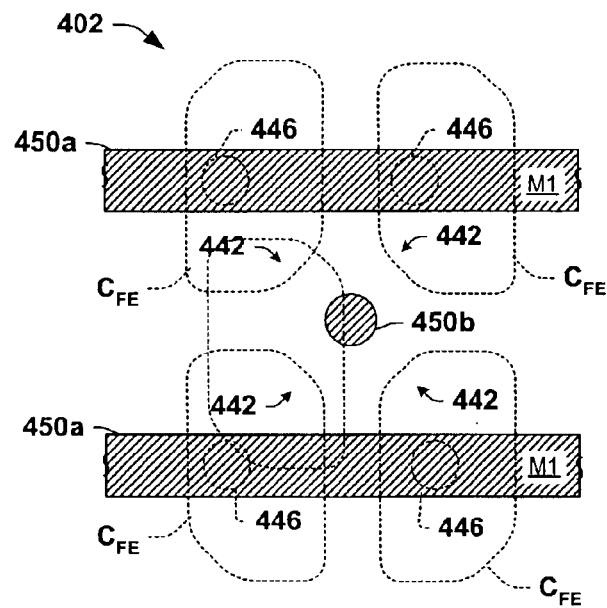

As seen also in FIGS. 5B and 5E, an ILD0 dielectric layer 434 and an ILD1 dielectric layer are formed over the semiconductor body, with conductive ILD0 contacts 436 being formed in the dielectric 434 to couple the source/drains with ferroelectric capacitor structures $C_{FE}$ formed over the ILD0 dielectric layer 434. Bitline ILD1 vias 446 are formed in the ILD1 layer to couple with the upper ferroelectric capacitor plates and with the bitline ILD0 contacts 436. An ILD2 dielectric layer 454 is formed over the ILD1 dielectric and the contacts 446. Conductive plateline structures 450a are formed along the array rows, and ILD1 bitline landing pads 450b are formed in a first metalization level (M1). As shown in FIG. 5C, bitline vias 456 are formed to contact the landing pads 450b and a fourth dielectric layer 464 (ILD3) is formed over the vias 456 and the ILD2 dielectric 454. Conductive bitline routing structures 460 are formed in ILD3 along array columns in the device 402. FIGS. 5F and 5G illustrate the cell arrangement of the device 402 in the presence of feature rounding caused by lithographic fabrication processing.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A semiconductor device, comprising:
   a ferroelectric memory cell array comprising a plurality of ferroelectric memory cells for storing data, the cell data being accessible along a plurality of bitlines, the cells being operated according to a plurality of plateline signals and a plurality of wordline signals, the ferroelectric memory cells individually comprising:
      a ferroelectric cell capacitor structure formed in a capacitor layer above a semiconductor body, the ferroelectric cell capacitor structure comprising a first conductive electrode electrically coupled with a plateline, a second conductive electrode, and a ferroelectric material formed between the electrodes; and
      a cell transistor comprising a gate electrically coupled with a wordline, a first source/drain electrically coupled with the second conductive electrode and a second source/drain electrically coupled with a bitline; and
   a plurality of conductive bitline structures extending from beneath the capacitor layer to a layer above the capacitor layer, individual conductive bitline structures passing through the capacitor layer proximate a corner of at least one of the ferroelectric cell capacitor structures.

2. The device of claim 1, wherein corners of the ferroelectric cell capacitor structures are recessed.

3. The device of claim 1, wherein the ferroelectric memory cells are organized in rows and columns in the array, with cells of a given row being coupled with a common wordline signal and cells of a given row being coupled with a common bitline, wherein the source/drains are formed in active regions of the semiconductor body and the gates are formed in conductive wordline structures between the source/drains, and wherein the conductive structures extend between the second source drains and a conductive bitline in an interconnect layer formed above the capacitor layer.

4. The device of claim 1, wherein the ferroelectric memory cells are organized in rows and columns in the array, with cells of a given row being coupled with a common wordline signal and cells of a given row being coupled with a common bitline, wherein the source/drains are formed in active regions of the semiconductor body and the gates are formed in conductive wordline structures between the source/drains, and wherein the active regions individually comprise a longitudinal side and a protrusion extending outwardly from the longitudinal side in the semiconductor body with the second source/drain being formed at least partially in the protrusion.

5. The device of claim 4, wherein the conductive bitline structures extend between the protrusion and a conductive bitline in an interconnect layer formed above the capacitor layer and wherein the conductive bitline structures extend through the capacitor layer proximate the corner of at least one of the ferroelectric cell capacitor structures.

6. The device of claim 5, wherein the ferroelectric cell capacitor structures are formed in a dielectric layer over the semiconductor body.

7. The device of claim 6, wherein the conductive wordline structures along individual rows are staggered.

8. The device of claim 7, wherein the conductive wordline structures comprise polysilicon.

9. The device of claim 4, wherein the conductive wordline structures along individual rows are staggered.

10. The device of claim 1, wherein individual conductive bitline structures pass through the capacitor layer proximate corners of at least three ferroelectric cell capacitor structures.

11. The device of claim 1, wherein the individual ferroelectric cell capacitor structures comprise at least two lateral sides, wherein the at least one corner is located between the lateral sides, and wherein the individual conductive bitline structures are located closer to a ferroelectric capacitor structure corner than to a ferroelectric capacitor lateral side.

12. A ferroelectric memory cell, comprising:
a ferroelectric capacitor structure formed in a capacitor layer above a semiconductor body, the ferroelectric capacitor structure comprising at least one corner, a first conductive electrode electrically coupled with a plateline, a second conductive electrode, and a ferroelectric material formed between the electrodes;
a transistor comprising a gate electrically coupled with a wordline, a first source/drain electrically coupled with the second conductive electrode, and a second source/drain electrically coupled with a bitline; and
a conductive bitline structure extending from beneath the capacitor layer to a layer above the capacitor layer, the conductive bitline structure passing through the capacitor layer proximate the at least one corner of the ferroelectric capacitor.

13. The ferroelectric memory cell of claim 12, wherein the at least one corner is recessed.

14. The ferroelectric memory cell of claim 12, wherein the first and second source/drains are formed in an active region of the semiconductor body and the gate is formed in a conductive wordline structure between the first and second source/drains, and wherein the conductive bitline structure extends between the second source drain and a conductive bitline in an interconnect layer formed above the capacitor layer.

15. The ferroelectric memory cell of claim 12, wherein the first and second source/drains are formed in an active region of the semiconductor body and the gate is formed in a conductive wordline structure between the first and second source/drains, and wherein the active region comprises a longitudinal side and a protrusion extending outwardly from the longitudinal side in the semiconductor body with the second source/drain being formed at least partially in the protrusion.

16. The ferroelectric memory cell of claim 15, wherein the conductive bitline structure extends between the protrusion and a conductive bitline in an interconnect layer formed above the capacitor layer and wherein the conductive bitline structure extends through the capacitor layer proximate the at least one corner of the ferroelectric capacitor structure.

17. The ferroelectric memory cell of claim 16, wherein the ferroelectric cell capacitor structure is formed in a dielectric layer over the semiconductor body.

18. The ferroelectric memory cell of claim 12, wherein the gate is formed in a conductive wordline structure between the first and second source/drains and wherein the conductive wordline structure is staggered.

19. The ferroelectric memory cell of claim 18, wherein the conductive wordline structure comprises polysilicon.

20. The ferroelectric memory cell of claim 12, wherein the ferroelectric cell capacitor structure comprises at least two lateral sides, wherein the at least one corner is located between the lateral sides, and wherein the conductive bitline structure is located closer to the at least one corner than to any of the lateral sides.

* * * * *